US009812352B2

(12) United States Patent
Chang et al.

(10) Patent No.: US 9,812,352 B2
(45) Date of Patent: Nov. 7, 2017

(54) SEMICONDUCTOR DEVICE AND METHOD FOR FABRICATING THE SAME

(71) Applicant: UNITED MICROELECTRONICS CORP., Hsin-Chu (TW)

(72) Inventors: Chich-Neng Chang, Pingtung County (TW); Ya-Jyuan Hung, Kaohsiung (TW); Bin-Siang Tsai, Changhua County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/011,629

(22) Filed: Jan. 31, 2016

(65) Prior Publication Data
US 2017/0200632 A1   Jul. 13, 2017

(30) Foreign Application Priority Data

Jan. 11, 2016   (CN) .......................... 2016 1 0015488

(51) Int. Cl.
*H01L 21/00* (2006.01)
*H01L 21/768* (2006.01)
*H01L 23/532* (2006.01)
*H01L 23/535* (2006.01)

(52) U.S. Cl.
CPC .... *H01L 21/7682* (2013.01); *H01L 21/76805* (2013.01); *H01L 21/76831* (2013.01); *H01L 21/76895* (2013.01); *H01L 23/535* (2013.01); *H01L 23/53295* (2013.01)

(58) Field of Classification Search
CPC ........... H01L 21/7682; H01L 21/76805; H01L 23/535
See application file for complete search history.

(56) References Cited

U.S. PATENT DOCUMENTS

| | | | |
|---|---|---|---|
| 2013/0161825 A1* | 6/2013 | Hsu | ................... H01L 21/76898 257/774 |
| 2015/0200160 A1 | 7/2015 | Su et al. | |
| 2016/0225731 A1* | 8/2016 | Chandolu | ............... H01L 24/13 |

* cited by examiner

Primary Examiner — Laura Menz
(74) Attorney, Agent, or Firm — Winston Hsu

(57) ABSTRACT

A method for fabricating semiconductor device is disclosed. First, a substrate is provided, a dielectric layer is formed on the substrate, and an opening is formed in the dielectric layer, in which the dielectric layer includes a damaged layer adjacent to the opening. Next, a dielectric protective layer is formed in the opening, a metal layer is formed in the opening, and the damaged layer and the dielectric protective layer are removed.

6 Claims, 5 Drawing Sheets

SEMICONDUCTOR DEVICE AND METHOD FOR FABRICATING THE SAME

BACKGROUND OF THE INVENTION

1. Field of the Invention

The invention relates to a method for fabricating semiconductor device, and more particularly, to a method of removing a damaged layer embedded in a dielectric layer.

2. Description of the Prior Art

With the trend in the industry being towards scaling down the size of the metal oxide semiconductor transistors (MOS), three-dimensional or non-planar transistor technology, such as fin field effect transistor technology (FinFET) has been developed to replace planar MOS transistors. Since the three-dimensional structure of a FinFET increases the overlapping area between the gate and the fin-shaped structure of the silicon substrate, the channel region can therefore be more effectively controlled. This way, the drain-induced barrier lowering (DIBL) effect and the short channel effect are reduced. The channel region is also longer for an equivalent gate length, thus the current between the source and the drain is increased. In addition, the threshold voltage of the FinFET can be controlled by adjusting the work function of the gate.

As the semiconductor industry enters 10 nm node generation, the contact area of contact plugs decreases significantly and results in resistance increase. In addition, damaged regions also formed in adjacent dielectric layer during the formation of contact holes to affect the operation of the device. Hence, how to effectively resolve this issue has become an important task in this field.

SUMMARY OF THE INVENTION

According to a preferred embodiment of the present invention, a method for fabricating semiconductor device is disclosed. First, a substrate is provided, a dielectric layer is formed on the substrate, and an opening is formed in the dielectric layer, in which the dielectric layer includes a damaged layer adjacent to the opening. Next, a dielectric protective layer is formed in the opening, a metal layer is formed in the opening, and the damaged layer and the dielectric protective layer are removed.

According to another aspect of the present invention, a semiconductor device is disclosed. The semiconductor device includes: a substrate; a dielectric layer on the substrate; a metal layer in dielectric layer; and a void adjacent between the metal layer and the dielectric layer. Preferably, the void includes: a first bottom surface aligned to a top surface of the substrate, and a second bottom surface higher than the top surface of the substrate.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
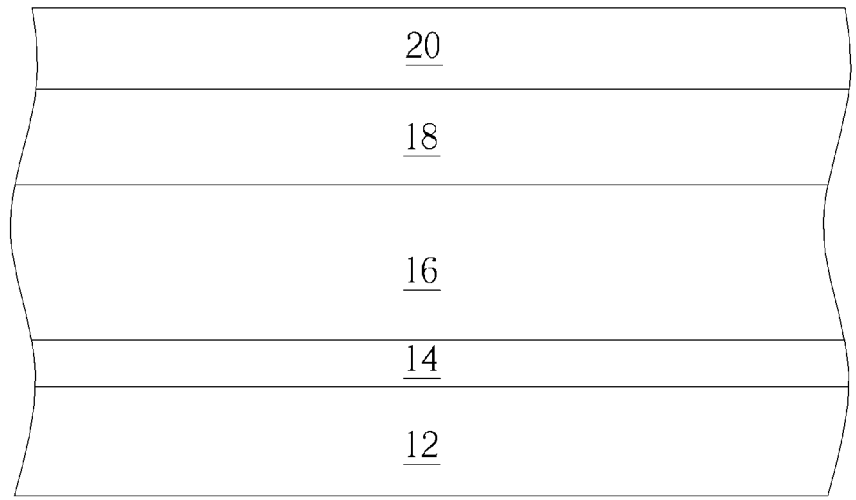
FIGS. 1-8 illustrate a method for fabricating semiconductor device according to a preferred embodiment of the present invention.

Referring to FIGS. 1-8, FIGS. 1-8 illustrate a method for fabricating semiconductor device according to a preferred embodiment of the present invention. As shown in FIG. 1, a substrate 12 is provided, and active devices such as MOS transistor and/or other passive devices could be formed on the substrate 12. Specifically, planar-type or non-planar type (such as FinFET) MOS transistors could be formed on the substrate 12, in which the MOS transistors could further include elements such as metal gates, source/drain regions, spacers, epitaxial layers, and CESLs. Since the fabrication of these elements within planar or non-planar transistors is well known to those skilled in the art, the details of which are not explained herein for the sake of brevity.

Next, a dielectric stack structure is formed on the substrate 12. For instance, a stop layer 14, a low-k dielectric layer 16, another dielectric layer 18, and a hard mask 20 are sequentially formed on the active devices and/or passive devices, in which the stop layer 14 is preferably an etch stop layer (ESL) containing nitrogen doped carbide (NDC) or silicon carbon nitride (SiCN), the dielectric layer 18 is composed of SiON, and the hard mask 20 is preferably composed of TiN, but not limited thereto. The low-k dielectric layer 16 could be selected from the group consisting of carbon-containing dielectric material, nitrogen-containing dielectric material, hydrogen-containing dielectric material, and porous dielectric structure, such as carbon-containing $SiO_2$, fluorine containing $SiO_2$, porous $SiO_2$, or porous carbon-containing $SiO_2$.

Figure 2:
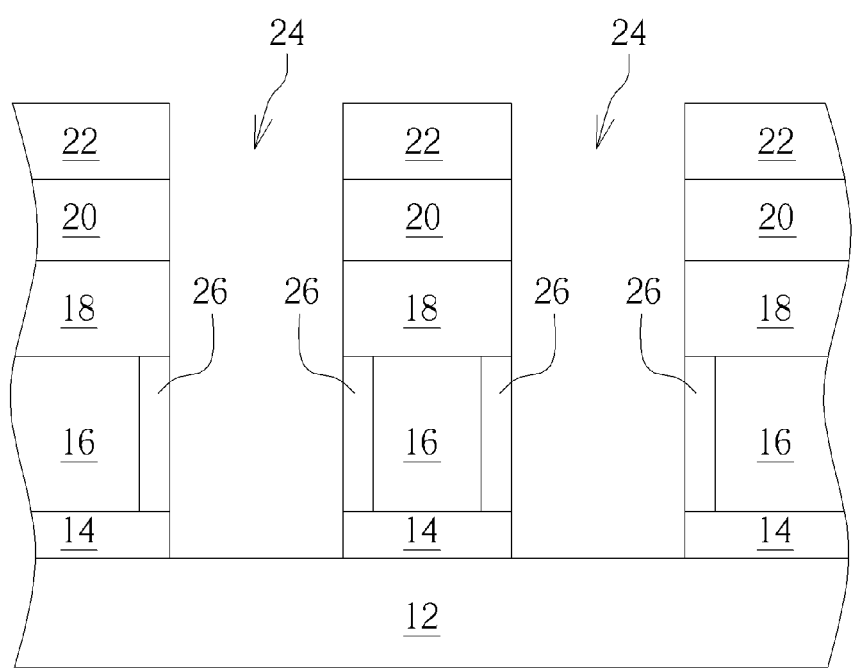

Next, as shown in FIG. 2, a photo-etching process is conducted by first forming a patterned resist 22 on the hard mask 20, and then conducting an etching process by using the patterned resist 22 as mask to remove part of the hard mask 20, part of the dielectric layer 18, part of the low-k dielectric layer 16, and part of the stop layer 14 for forming openings 24 exposing the substrate 12 surface and active devices (not shown) on the substrate 12. It should be noted that the plasma etching used to form the openings 24 typically damages part of the dielectric layer structure and forms damaged portions or damaged layers 26 in part of the low-k dielectric layer 16 adjacent to the openings 24.

Figure 3:
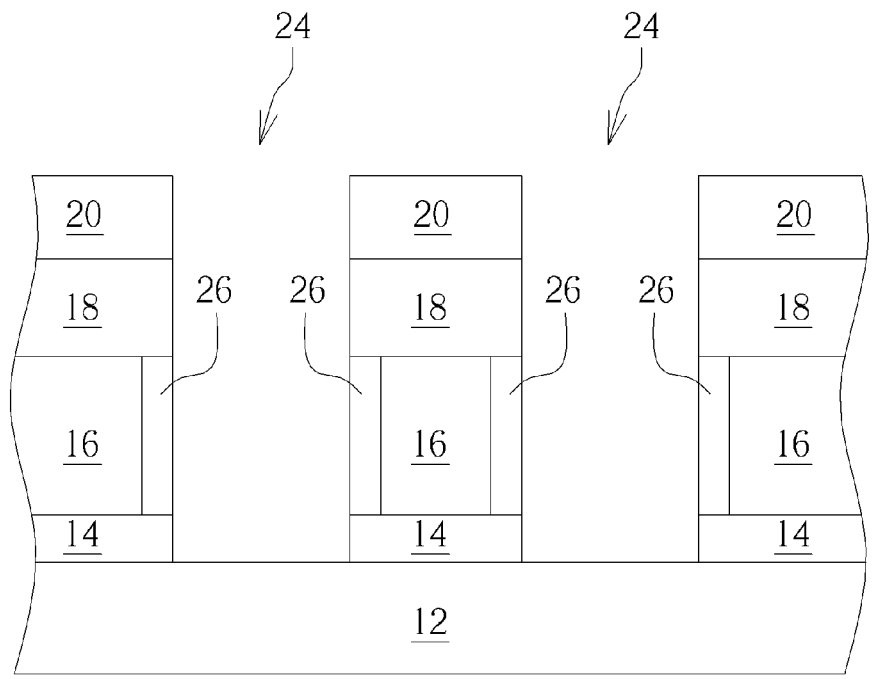

Next, as shown in FIG. 3, an ashing process is conducted to remove the patterned resist 22 and expose the hard mask 20 surface.

Figure 4:
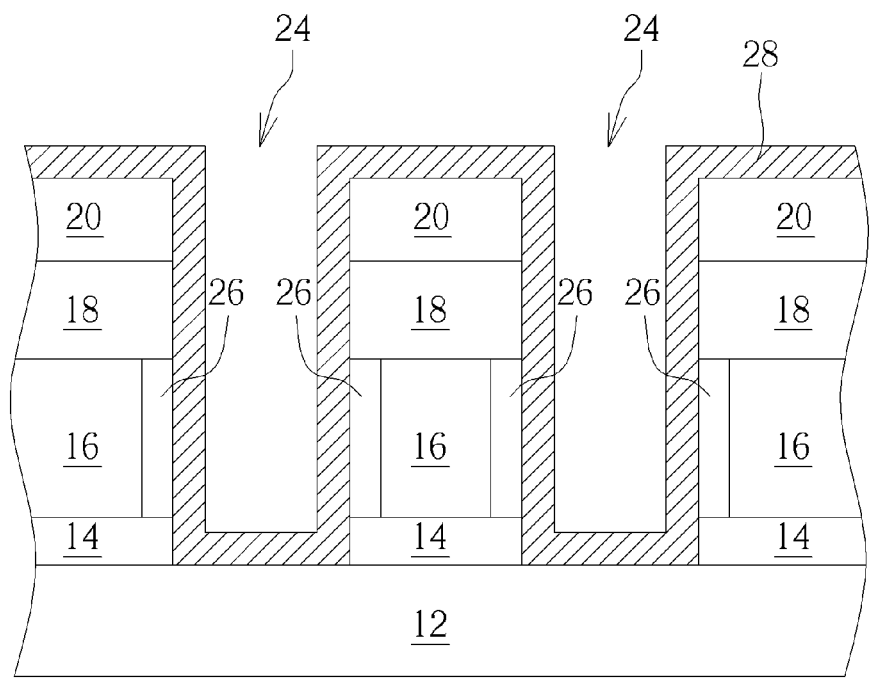

Next, as shown in FIG. 4, a dielectric protective layer 28 is deposited in the openings 24 and on the top surface of the hard mask 20, sidewalls of the hard mask 20, sidewalls of the dielectric layer 18, sidewalls of the damaged layers 26, sidewalls of the stop layer 14, and part of the substrate 12 surface. In this embodiment, the dielectric protective layer 28 is preferably a single layered structure composed of SiN, but not limited thereto.

Figure 5:
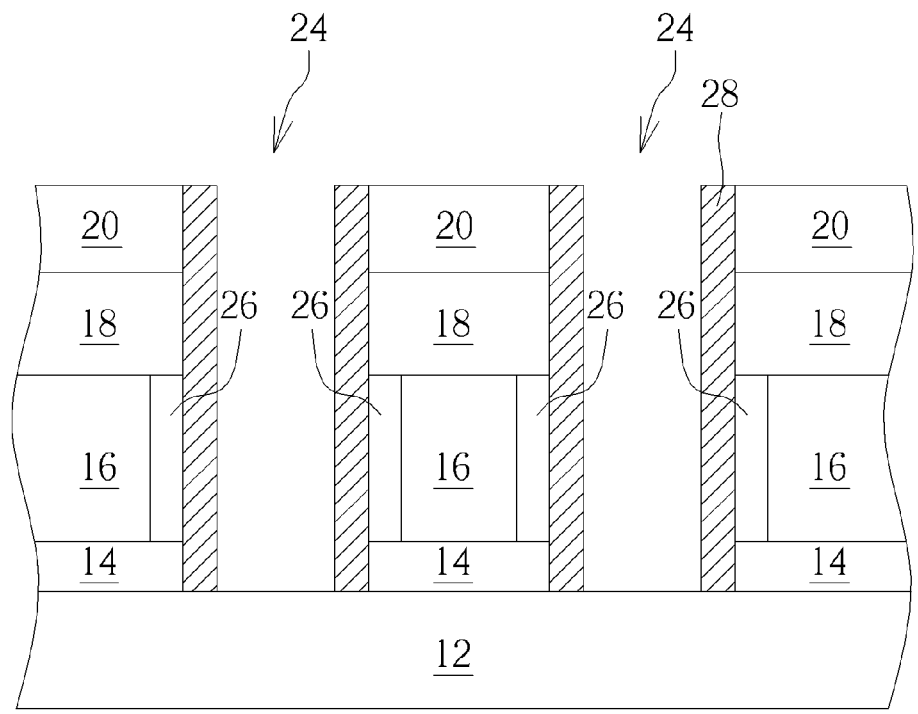

Next, as shown in FIG. 5, a dry etching process, such as an anisotropic etching process is conducted to remove part of the dielectric protective layer 28 on the hard mask 20 and the dielectric protective layer 28 on the substrate 12, so that the remaining dielectric layer 28 is still disposed on the sidewalls of the hard mask 20, dielectric layer 18, damaged layer 26, and stop layer 14.

Figure 6:
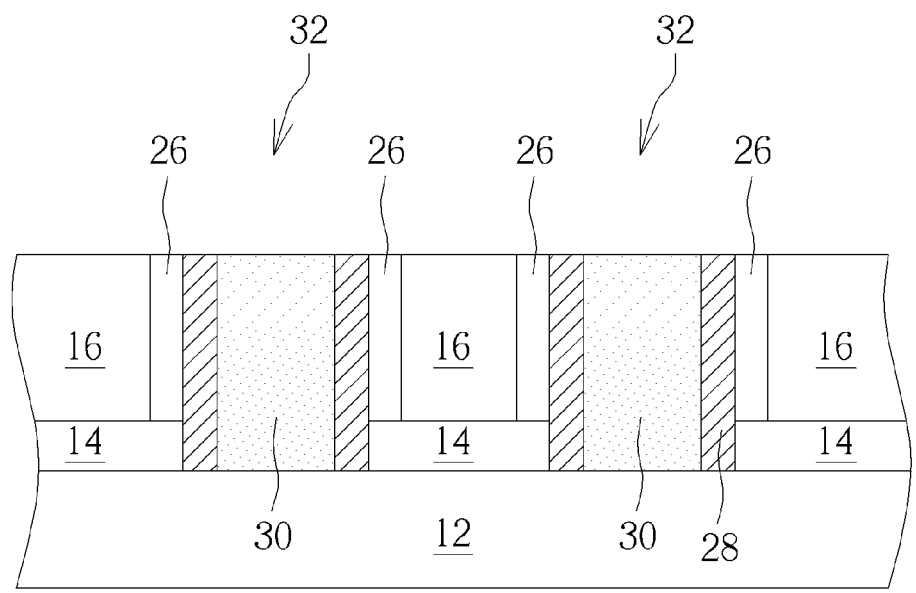

Next, as shown in FIG. 6, a contact plug formation or inter-connective process is conducted to form contact plugs in the openings 24 for electrically connecting and contacting the active devices or passive devices on the substrate 12 surface. In this embodiment, the formation of the contact plugs could be accomplished by sequentially depositing a barrier layer (not shown) and a metal layer 30 on the substrate 12, sidewalls of the dielectric protective layer 28, and top surface of the hard mask 20 and filling the openings 24, and then conducting a planarizing process, such as chemical mechanical polishing (CMP) process to remove part of the metal layer 30, part of the barrier layer, part of the dielectric protective layer 28, the hard mask 20, and the dielectric layer 18. This forms contact plugs 32 in the openings 24 and exposes the damaged layers 26 that were embedded in the low-k dielectric layer 16, in which the top surfaces of the contact plugs 32, damaged layers 26, low-k dielectric layer 16, and dielectric protective layers 28 are coplanar. In this embodiment, the barrier layer preferably selected from the group consisting of Ti, Ta, TiN, TaN, and WN, and the metal layer 30 is preferably selected from the group consisting of Al, Ti, Ta, W, Nb, Mo, and Cu.

Figure 7:
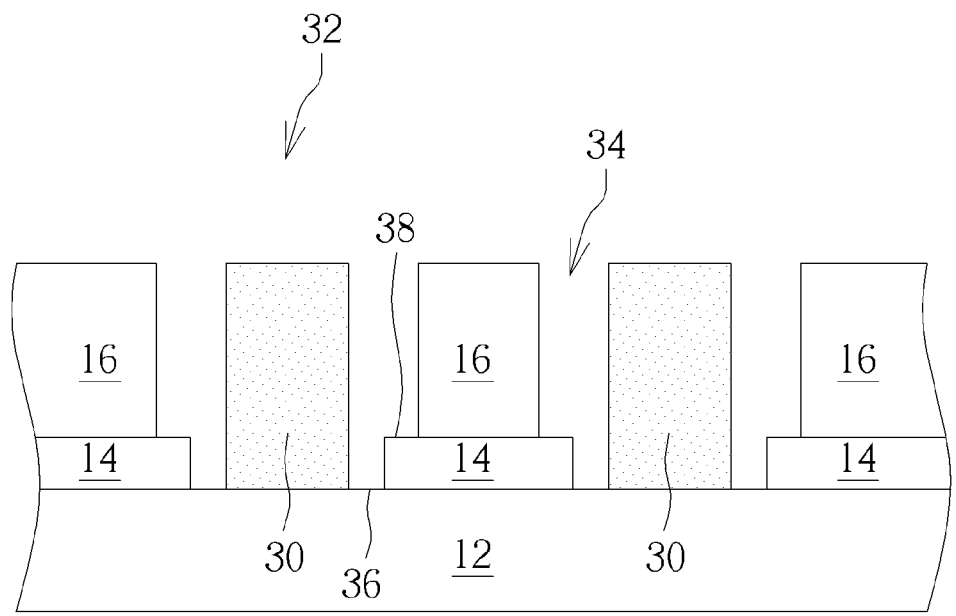

Next, as shown in FIG. 7, a first etching process is conducted to remove the damaged layers 26 and a second etching process is conducted to remove the dielectric protective layers 28 for forming voids 34 in the original position of the layers 26 and 28. In this embodiment, the lower portion of each of the voids 34 reveals a substantially step-shaped profile, in which each void 34 has a first bottom surface 36 aligned to a top surface of the substrate 12 and a second bottom surface 38 higher than the top surface of substrate 12 or even with the top surface of stop layer 14.

In this embodiment, different etchants are used in the first etching process and second etching process individually for removing the damaged layers 26 and dielectric protective layers 28, in which an etchant containing HF is preferably used during the first etching process to remove the damaged layers 26 and an etchant selected from the group consisting of phosphoric acid and water is used during the second etching process to remove the dielectric protective layers 28. It should be noted that even though the first etching process using etchant containing HF to remove damaged layers 26 is conducted before the second etching process using etchant containing phosphoric acid and water to remove dielectric protective layers 28, it would also be desirable to remove the dielectric protective layers 28 before removing the damaged layers 26 depending on the demand of the process, which is also within the scope of the present invention.

Figure 8:
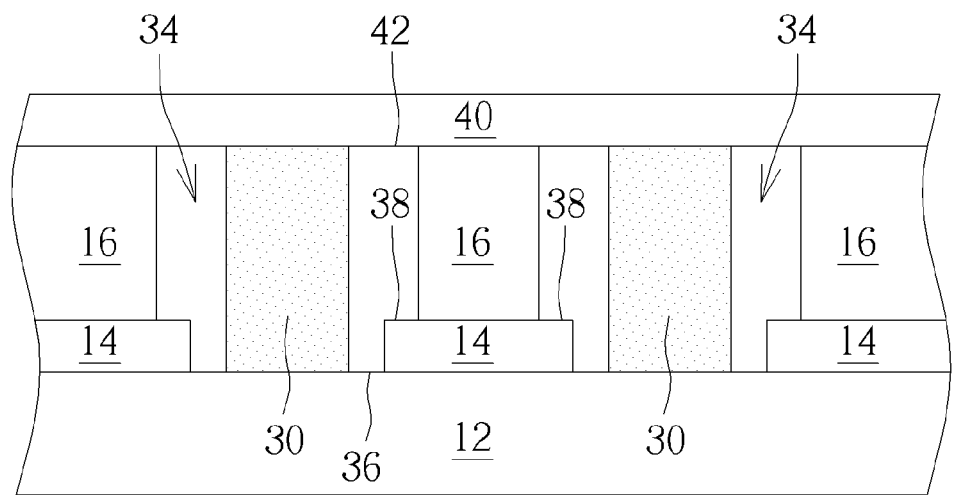

Next, as shown in FIG. 8, a cap layer 40 is formed on the low-k dielectric layer 16, voids 34, and metal layers 30 so that the voids 34 are completely surrounded by the substrate 12, stop layer 14, low-k dielectric layer 16, metal layers 30, and cap layer 40. In this embodiment, the cap layer 40 is preferably composed of a nitrogen doped carbide (NDC) layer, but not limited thereto. This completes the fabrication of a semiconductor device according to a preferred embodiment of the present invention.

Referring again to FIG. 8, which further illustrates a structural view of a semiconductor device according to a preferred embodiment of the present invention. As shown in FIG. 8, the semiconductor device includes a substrate 12, a dielectric layer or a low-k dielectric layer 16 on the substrate 12, a stop layer 14 between the low-k dielectric layer 16 and substrate 12, metal layers 30 in the low-k dielectric layer 16, voids 34 between metal layers 30 and low-k dielectric layer 16, and a cap layer 40 on the low-k dielectric layer 16 and metal layers 30.

Specifically, each of the voids 34 between the metal layers 30 and low-k dielectric layer 16 preferably includes a first bottom surface 36 aligned to the top surface of substrate 12, a second bottom surface 38 higher than the top surface of substrate 12 or even with the top surface of stop layer 14, and a top surface 42 even with the top surfaces of the low-k dielectric layer 16 and metal layers 30. Viewing from another perspective, the bottom portion of each voids 34 reveals a non-uniform step-shaped profile instead of a regular rectangular or circular shape.

It should be noted that despite the metal layers 30 are preferably contact plugs connected to active devices on the substrate 12 in this embodiment, the metal layers 30 could also be metal interconnections electrically connecting to other metal lines according to another embodiment of the present invention.

Figure 9:
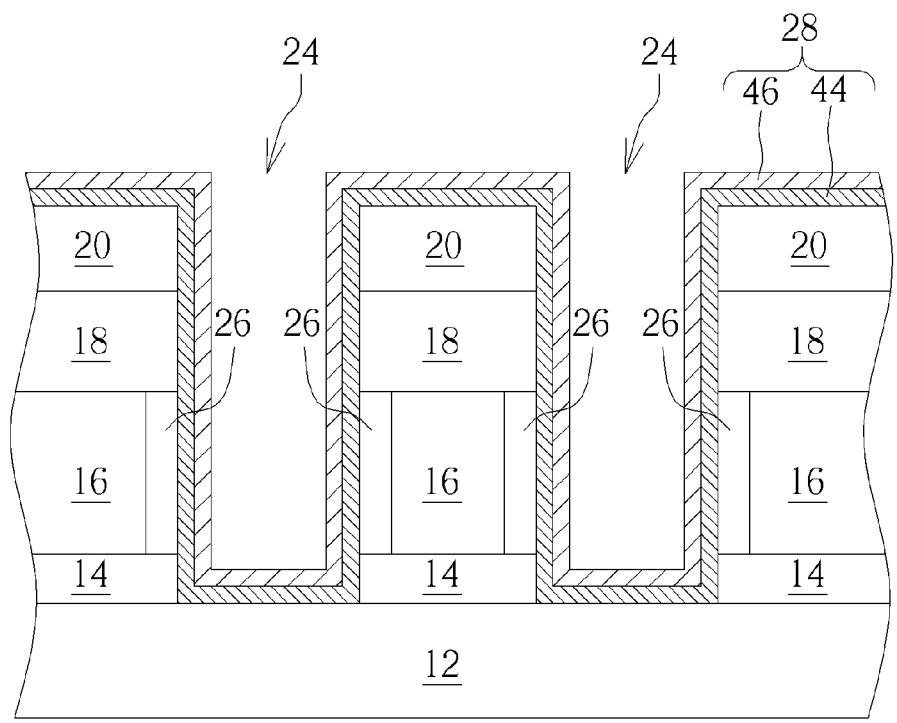
FIGS. 9-10 illustrate a method for fabricating semiconductor device according to an embodiment of the present invention.
Figure 10:
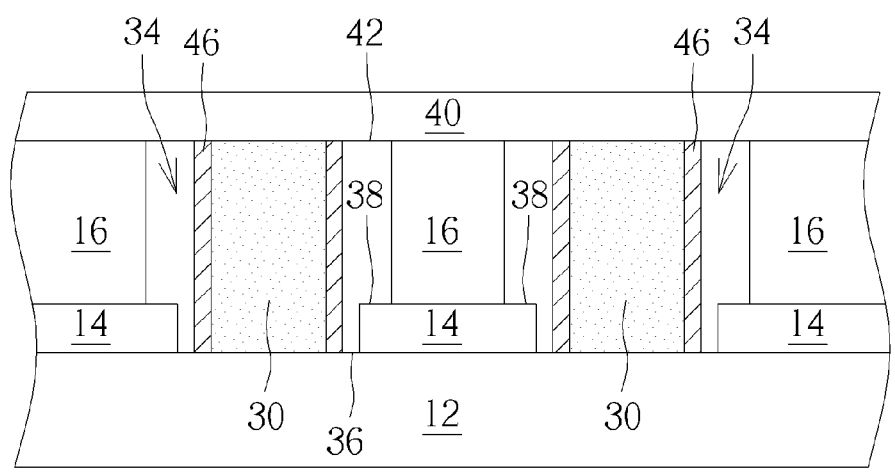

Referring to FIGS. 9-10, FIGS. 9-10 illustrate a method for fabricating a semiconductor device according to another embodiment of the present invention. As shown in FIG. 9, instead of deposing a single-layered dielectric protective layer 28 as disclosed in the aforementioned embodiment, a dual-layered dielectric protective layer 28 is deposited in this embodiment. For instance, it would be desirable to first removes the patterned resist 22 as shown in FIG. 3, and then deposits a first dielectric protective layer 44 composed of SiN and a second dielectric protective layer 46 composed of SiCN in the openings 24, in which the first dielectric protective layer 44 contacts the sidewalls of the hard mask 20, dielectric layer 18, damaged layers 26, and stop layer 14.

Next, as shown in FIG. 10, an anisotropic etching process similar to the one disclosed in FIG. 5 is conducted to remove the dielectric protective layer 28 on the top surface of hard mask 20 and on the substrate 12 surface, and metal layers 30 are deposited into the openings 24 as disclosed in FIG. 6 and part of the metal layers 30, part of the barrier layer, part of the dielectric protective layer 28, the hard mask 20, and dielectric layer 18 are removed by CMP process. At this stage the top surfaces of the first dielectric protective layer 44 and second dielectric protective layer 46 are even with the top surfaces of the metal layers 30, damaged layer 26, and low-k dielectric layer 16.

Next, a first etching process is conducted to remove the damaged layers 26 and then a second etching process is conducted to remove part of the dielectric protective layer 28 for forming voids 34. It should be noted since the dielectric protective layer 28 in this embodiment is a dual-layered structure, only part of the dielectric protective layer 28, such as only the first dielectric protective layer 44 composed of SiN is removed after the damaged layers 26 are removed, so that the second dielectric protective layer 46 still remains on the sidewalls of the metal layers 30 or between the metal layers 30 and voids 34. In this embodiment, the etchants used in the first etching process and second etching process are preferably the same as the ones disclosed in the aforementioned embodiment. For instance, an etchant containing HF is preferably used in the first etching process for removing the damaged layers 26 while an etchant containing phosphoric acid and water is used in the second etching process for removing the first dielectric protective layer 44.

Overall, the present invention forms contact holes or openings in a dielectric layer, deposits a dielectric protective layer in the openings, fills the openings with a metal layer, removes part of the dielectric and part of the metal layer to expose the damaged layer that was embedded in the dielectric layer, and then conducts two etching processes to remove the damaged layers and the dielectric protective layer for forming voids.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
   a substrate;
   a dielectric layer on the substrate;
   a stop layer between the dielectric layer and the substrate, wherein the stop layer contacts the substrate directly and the dielectric layer covers a top surface of the stop layer;
   a metal layer in dielectric layer;
   a void between the metal layer and the dielectric layer and exposes a top surface of the substrate, wherein none of a damaged layer of the dielectric layer is remained at between the dielectric layer and the void and the void comprises:
     a first bottom surface aligned to the top surface of the substrate; and
     a second bottom surface higher than the top surface of the substrate; and
   a cap layer on and covering the dielectric layer, the void, and the metal layer.

2. The semiconductor device of claim 1, wherein the second bottom surface of the void and a top surface of the stop layer are coplanar.

3. The semiconductor device of claim 1, wherein a top surface of the void and a top surface of the dielectric layer are coplanar.

4. The semiconductor device of claim 1, further comprising a dielectric protective layer adjacent to the metal layer.

5. The semiconductor device of claim 4, wherein a top surface of the dielectric protective layer and a top surface of the void are coplanar.

6. The semiconductor device of claim 4, wherein a bottom surface of the dielectric protective layer and the first bottom surface of the void are coplanar.

* * * * *